(12) United States Patent
Lehmann et al.

(10) Patent No.: US 11,508,417 B2
(45) Date of Patent: *Nov. 22, 2022

(54) MEMORY CELL DEVICE AND METHOD FOR OPERATING A MEMORY CELL DEVICE

(71) Applicant: Infineon Technologies AG, Neubiberg (DE)

(72) Inventors: Gunther Lehmann, Holzkirchen (DE); Prashant Chaudhry, Munich (DE); Frederic Gueganton, Plouarzel (FR); Gurushiddappa Naduvinamane, Munich (DE); Steffen Schumann, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/399,466

(22) Filed: Aug. 11, 2021

(65) Prior Publication Data

US 2021/0375330 A1 Dec. 2, 2021

Related U.S. Application Data

(63) Continuation of application No. 16/711,946, filed on Dec. 12, 2019, now Pat. No. 11,139,003.

(30) Foreign Application Priority Data

Dec. 21, 2018 (DE) .......................... 102018133392.7

(51) Int. Cl.
*G11C 5/14* (2006.01)
(52) U.S. Cl.
CPC ..................................... *G11C 5/14* (2013.01)

(58) Field of Classification Search
CPC ... G11C 5/14; G11C 2207/2227; G11C 5/147; G11C 11/417
See application file for complete search history.

(56) References Cited

U.S. PATENT DOCUMENTS 5,726,946 A 3/1998 Yamagata et al.
6,977,519 B2 12/2005 Bhavnagarwala et al.
(Continued)

OTHER PUBLICATIONS

Agarwal, Kanak et al., "Power Gating with Multiple Sleep Modes", IBM Research, IEEE Proceedings of the 7th International Symposium on Quality Electronic Design, The Computer Society, Mar. 27-29, 2006, 5 pages.

(Continued)

*Primary Examiner* — Tri M Hoang
(74) *Attorney, Agent, or Firm* — Slater Matsil, LLP (57) ABSTRACT

In accordance with an embodiment, a memory cell device includes at least one memory cell; a first switch connected between the at least one memory cell and a reference potential node; a second switch connected between the at least one memory cell and the reference potential node, and switch driver logic adapted to put the first switch selectively into one of at least three operating states by activation or deactivation of a first subcircuit of the switch driver logic, wherein the at least three operating states comprises an on state, an off state, and a conductive state in which an electrical conductivity of the first switch is lower than in the on state and higher than in the off state, and put the second switch selectively into one of the at least three operating states by activation or deactivation of a second subcircuit of the switch driver logic.

35 Claims, 8 Drawing Sheets

(56) References Cited

U.S. PATENT DOCUMENTS

| | | |
|---|---|---|
| 7,110,317 B2 | 9/2006 | Song et al. |
| 11,139,003 B2 * | 10/2021 | Lehmann .............. G11C 11/417 |
| 2009/0189684 A1 | 7/2009 | Gouin |
| 2012/0013319 A1 | 1/2012 | Patil et al. |
| 2012/0326772 A1 | 12/2012 | Myers et al. |
| 2016/0260473 A1 | 9/2016 | Fukuda |
| 2017/0309326 A1 | 10/2017 | Sawada et al. |

OTHER PUBLICATIONS

Nii, Koji, et al., "A dynamic/static SRAM power management scheme for DVFS and AVS in advanced automotive infotainment SoCs", Digest of Technical Papers, IEEE Symposium on VLSI Technology, Sep. 21, 2016.

* cited by examiner

MEMORY CELL DEVICE AND METHOD FOR OPERATING A MEMORY CELL DEVICE

CROSS-REFERENCE TO RELATED APPLICATIONS

This application is a continuation of U.S. patent application Ser. No. 16/711,946, filed Dec. 12, 2019, now U.S. Pat. No. 11,139,003, which application claims the benefit of German Application No. 102018133392.7, filed on Dec. 21, 2018, which applications are hereby incorporated herein by reference in their entireties.

TECHNICAL FIELD

The invention relates to a memory cell device and to a method for operating a memory cell device.

BACKGROUND

Wireless products (i.e., electronic devices which are adapted for wireless data exchange, for example cell phones, laptops or tablets), chip card products (example cards for identification, for example identity cards, insurance cards, for example medical insurance cards, or payment cards, for example credit cards), products from the automobile sector (for example a motor controller for the motor which is responsible for the vehicle propulsion (for example an internal combustion engine or an electric motor) and/or for other motors, for example window lifter) or apparatuses or devices which are used for automated driving and products for energy management, are examples of such products which may provide a low-energy mode.

Most integrated circuits comprise memory circuits for storing data. In order to be able to provide a product having a low-energy mode, the memory circuits may be correspondingly be operable with a low energy consumption.

A part of the energy consumption in memory circuits is caused by leakage currents. In microcontroller products in the automobile sector, the number of SRAM memory cells has about doubled with the change from a 40 nm technology to a 28 nm technology. At the same time, the leakage current per bit occurring in the SRAM has increased (for example nearly doubled). This means that the leakage current contribution of the SRAM memory has increased by nearly four times.

Memory circuits may be designed to reduce leakage current and permit a low-energy mode which is robust, adjustable, favorable in terms of the required (chip) area and simple to implement, while ensuring preservation of the stored data.

SUMMARY

In various exemplary embodiments, a memory cell device is provided. The memory cell device may comprise at least one memory cell, a first switch connected between the at least one memory cell and a reference potential, and a switch driver logic, which is adapted to put the first switch selectively into one of at least three operating states by activation or deactivation of a first subcircuit of the switch driver logic: on state, off state, and a conductive state in which the electrical conductivity is lower than in the on state and higher than in the off state.

The conductive state may be provided by means of a diode, for example by the first switch comprising a transistor which can be switched on for the on state and off for the off state, and which can be operated in a diode mode for the conductive state.

The at least three operating states (on state, off state, conductive state) can be implemented by means of a single switch, so that it is possible to save on chip area.

In various exemplary embodiments, the memory cell device may comprise a second switch connected between the at least one memory cell and the reference potential, the switch driver logic furthermore being able to be adapted to put the second switch selectively into one of at least three operating states by activation or deactivation of a second subcircuit of the switch driver logic: on state, off state, and a conductive state in which the electrical conductivity is lower than in the on state and higher than in the off state.

In various exemplary embodiments, it may for example be made possible to adapt a voltage level at VSSC (or VDDC) during a low-energy mode to characteristic properties of the memory cells inside the memory array, for example by bringing only one of the switches into one state while the other switch is left in another state.

Furthermore, in various exemplary embodiments an occurrence of high peak current when switching the memory cell device from a low-energy mode into an active ("ON") mode can be reduced, for example by in succession initially switching a first switching element before a further (for example second) switching element is switched on.

In various exemplary embodiments, all the switching elements may contribute to the voltage supply in the active mode ("on mode").

An "off mode" may be implemented by bringing all the switching elements into the "off mode".

In various exemplary embodiments, the ground voltage supply may be configured to be switchable, or a positive voltage supply, or both.

BRIEF DESCRIPTION OF THE DRAWINGS

Exemplary embodiments of the invention are represented in the figures and will be explained in more detail below.

DETAILED DESCRIPTION OF ILLUSTRATIVE EMBODIMENTS

In the following detailed description, reference is made to the appended drawings, which form part of this description and in which specific embodiments, in which the invention may be carried out, are shown for illustration. In this regard, direction terminology such as "up", "down", "forward", "backward", "front", "rear", etc. is used with reference to the orientation of the figure(s) being described. Since component parts of exemplary embodiments may be positioned in a number of different orientations, the direction terminology is used for illustration and is in no way restrictive. It is to be understood that other exemplary embodiments may be used, and structural or logical variations may be carried out, without departing from the protective scope of the present invention. It is to be understood that the features of the various exemplary embodiments described herein may be combined with one another, unless otherwise specifically indicated. The following detailed description is therefore not to be interpreted in a restrictive sense, and the protective scope of the present invention is defined by the appended claims.

In the scope of this description, terms such as "connected", "attached" or "coupled" are used to describe both direct and indirect connection, direct or indirect attachment and direct or indirect coupling. In the figures, elements which are identical or similar are provided with identical references, insofar as this is expedient.

Various exemplary embodiments are described herein for apparatuses, and various exemplary embodiments are described for methods. It is to be understood that features and properties which are described in connection with apparatuses also apply for methods, and vice versa.

Embodiments of the invention relate to memory circuits, in particular memory circuits which offer a low-energy mode. A low-energy mode is intended to mean a type of operation with a low energy consumption. In some applications, this is also referred to as a low-power mode or as a standby mode.

The memory cell devices, or the associated circuits, may be those for volatile data storage, for example SRAM (Static Random Access Memory) or DRAM (Dynamic Random Access Memory) memory circuits. These must be provided with a determined holding voltage at their power supply nodes for data preservation of the stored data.

Products with a low energy consumption are based on, or contain, integrated circuits which can themselves in turn be operated in the low-energy mode. In some embodiments, high peak currents when switching from the low-energy mode to normal operation (also referred to as an active mode, active-power mode or active operating mode) are advantageously avoided.

Figure 2A:
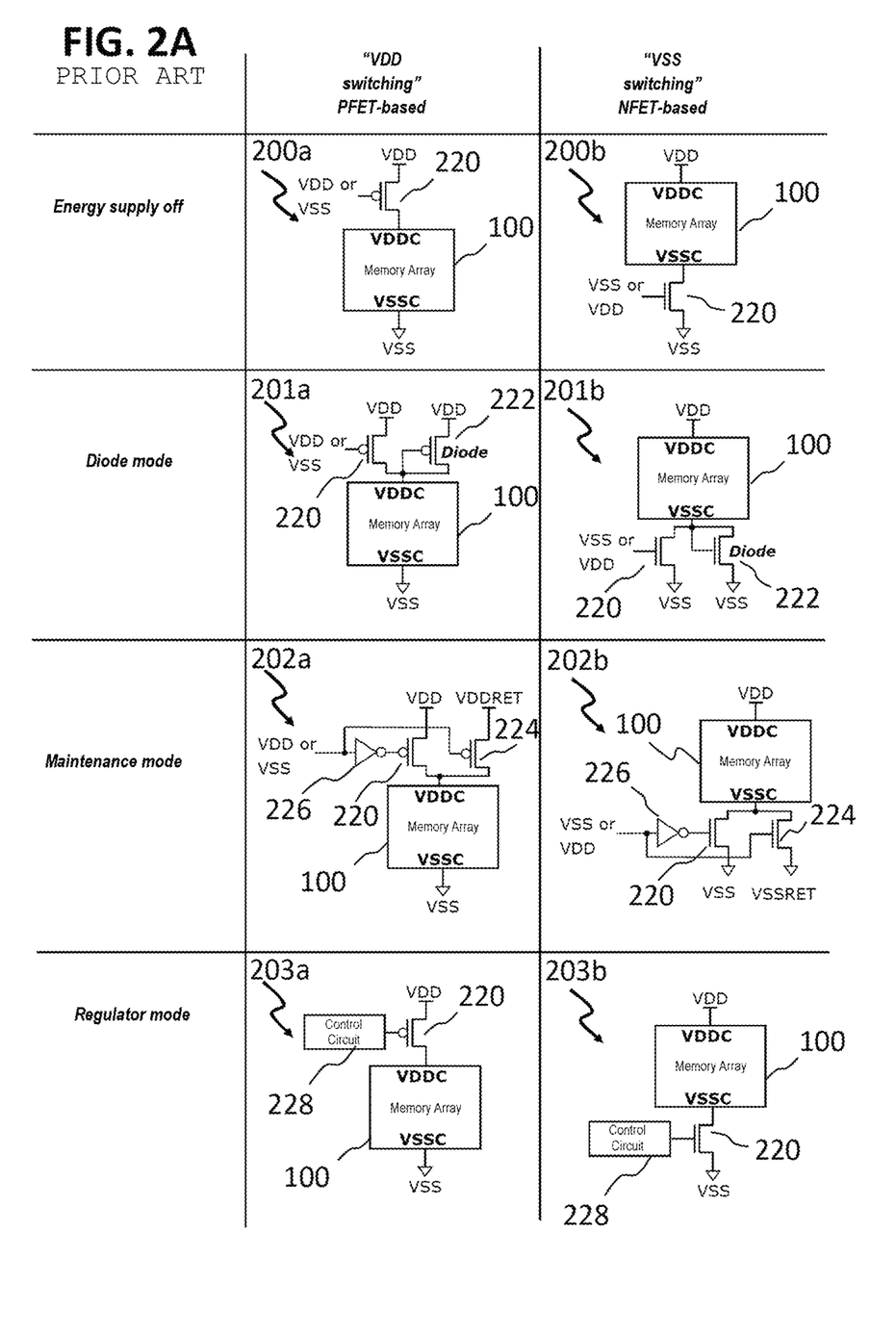
FIG. 2A shows a compilation of various schematically represented memory cell devices according to the prior art.

FIG. 2A schematically represents several memory cell devices known from the prior art, respectively in a variant in which a positive voltage supply VDD is switched (in this case, a PFET transistor is switched, represented in the column "VDD switching", PFET-based) and in a variant in which a negative voltage supply or a ground terminal VSS is switched (in this case, an NFET transistor is switched, represented in the column "VSS switching", NFET-based).

In a relatively simply constructed memory cell device 200a, 200b (represented in the first row of FIG. 2A, denoted by "energy supply off"), a supply voltage VDD or VSS of a memory cell array 100 can be switched on or off by means of a transistor 220 connected between the memory cell array 100 and the voltage supply VSS or VDD. This, however, means that information stored in the memory cell array 100 is lost in the off state in the case of a volatile memory cell array 100.

One possibility for providing a reduced operating voltage to the memory cell array 100 for a low-energy mode may be to use a diode.

In the row of FIG. 2A denoted by "diode mode", a memory cell device 201a, 201b is represented in which a transistor acting as a diode 222 is connected in parallel with the voltage supply VSS or VDD which can be switched on and off by means of a switch (transistor). If the switch 220 is switched off, a reduced operating voltage can be provided for the memory cell array 100 in a low-energy mode via the diode 222, so that leakage currents can be reduced.

An example of such a memory cell device 201a, 201b from U.S. Pat. No. 7,110,317 B2 is represented in FIG. 2B (middle).

Figure 2B:
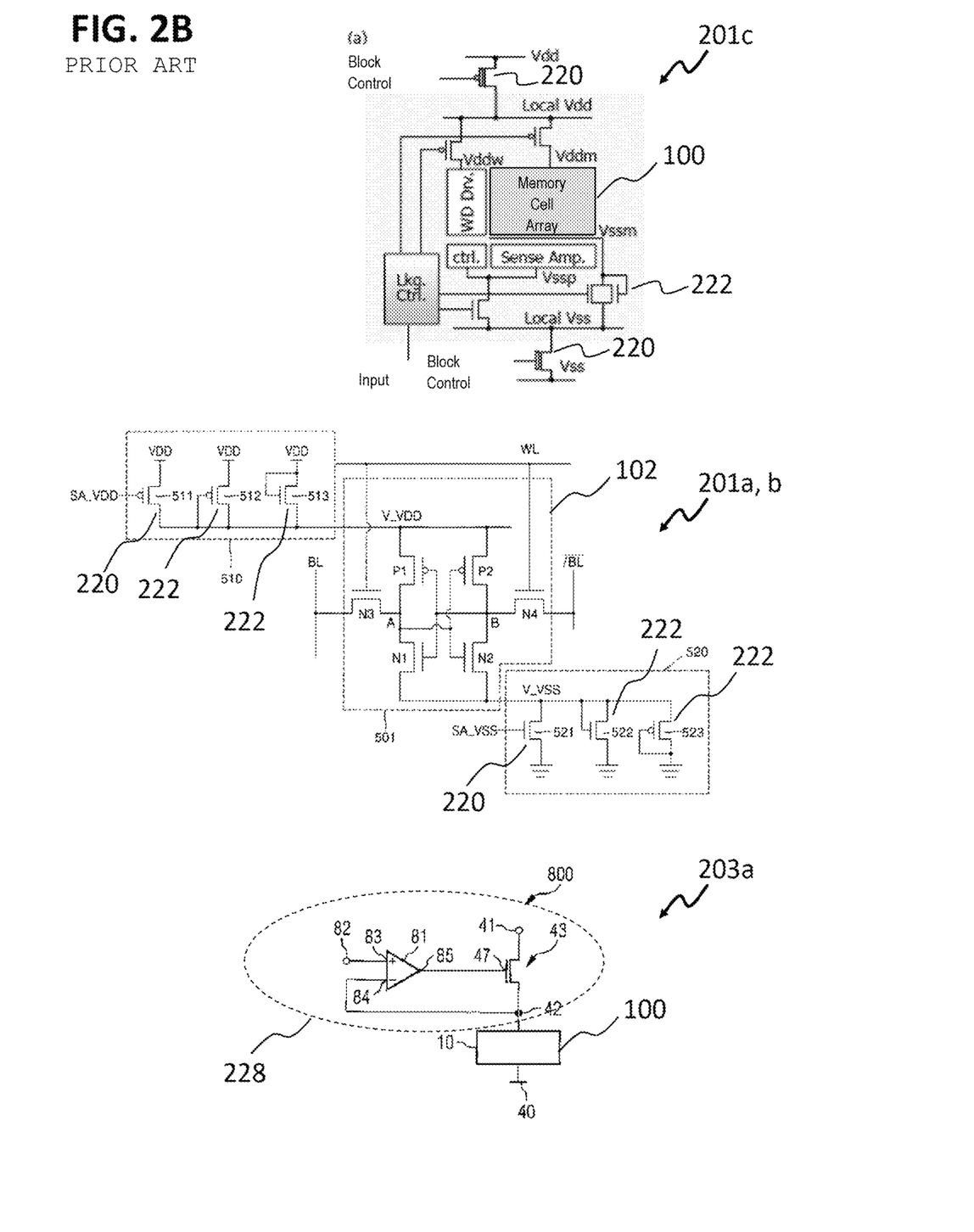
FIG. 2B shows examples of memory cell devices according to the prior art.

Koji Nii et al., in their article "A dynamic/static SRAM power management scheme for DVFS and AVS in advanced automotive infotainment SoCs" (Digest of Technical Papers—IEEE Symposium on VLSI Technology, 21 Sep. 2016) in its FIG. 3, reproduced here in FIG. 2B (top), present an example in which a reduced operating voltage can be provided by means of a diode 222 connected in series with a main switch 220.

However, such a configuration with use of a main switch 220 and an additional diode 222 means that although chip area must be provided for both components (main switch 220 and diode 222), the diode 222 nevertheless makes only a small contribution to the voltage supply of the memory cell array 100 in an active mode (i.e., in normal operation). Furthermore, the voltage (VSSC or VDDC) provided by means of the diode in the low-energy mode cannot be adjusted. This configuration furthermore has the disadvantage that the voltage supply of the memory cell array 100 is delivered through a series circuit of components, so that an undesired increased voltage drop at this series circuit occurs, which in turn can be compensated for only by increasing the chip area.

In FIG. 2A a so-called "maintenance mode" is represented in the third row. In this case, a reduced maintenance voltage VDDRET (or increased maintenance voltage VSSRET) relative to the operating voltage for normal operation VDD (or VSS) can be switched on by means of a transistor 224.

For the "maintenance mode", however, a separate VDDRET voltage supply (or VSSRET voltage supply) is required on the chip, which takes up chip area and increases a wiring complexity. Furthermore, area is required for a circuit for generating the VDDRET voltage (or VSSRET voltage).

A situation-dependent adjustment of the VSSRET voltage, however, cannot be provided with this configuration when the circuit generating the VSSRET voltage or the VSSRET voltage supply are used together (for example by a plurality of memory cells).

A relatively elaborate configuration is represented in FIG. 2A in the last row (denoted by "regulator mode") for a memory circuit 203a, b. In this case, a control circuit 228 for driving a gate of a main switch 220 is provided.

The control circuit 228 in this configuration is complex, sensitive to changes/variations and takes up chip area and additional energy.

A corresponding configuration example for a memory circuit 203a according to U.S. Publication No. 2009/0189684 A1 is represented in FIG. 2B (bottom).

In various exemplary embodiments, a memory cell device has a low-energy mode for its memory elements is provided. The memory cell device may comprise at least one switching element that provides more than two modes, for example ON/OFF/DIODE. In contrast thereto, conventional implementations utilize combinations of switching elements in which each switching element provides only one mode (DIODE) or alternatively two modes (ON/OFF).

Figure 3:
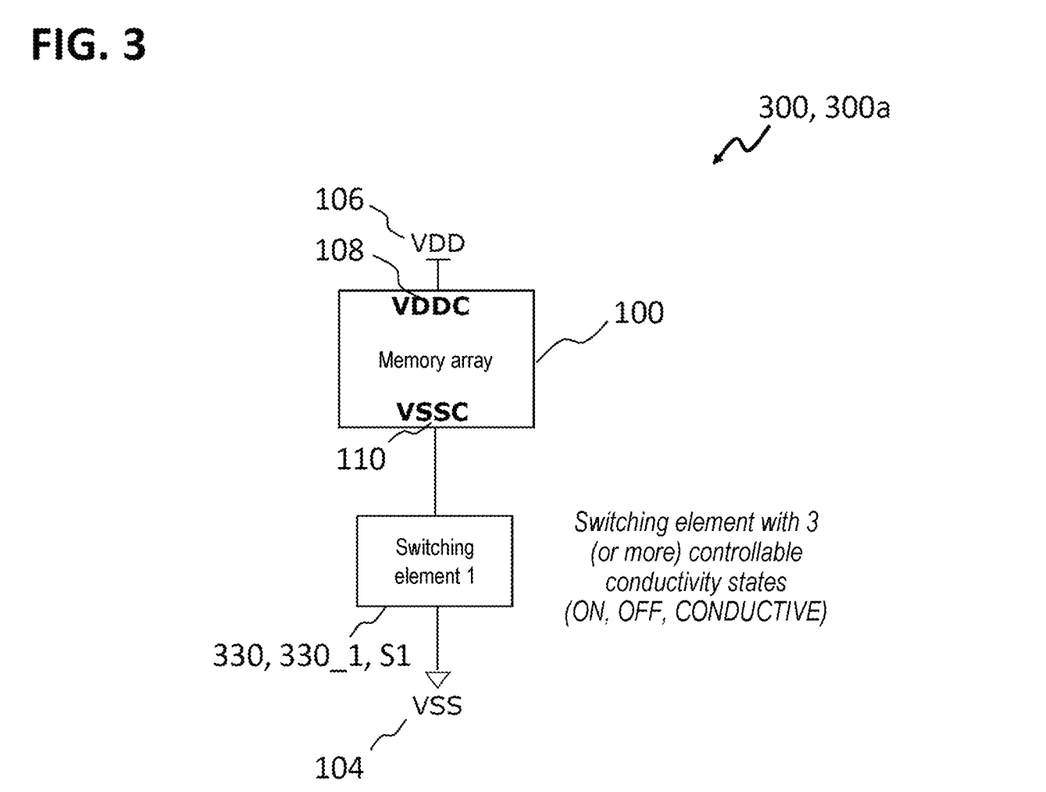
FIG. 3 shows a schematic representation of a memory cell device according to various exemplary embodiments.
Figure 4:
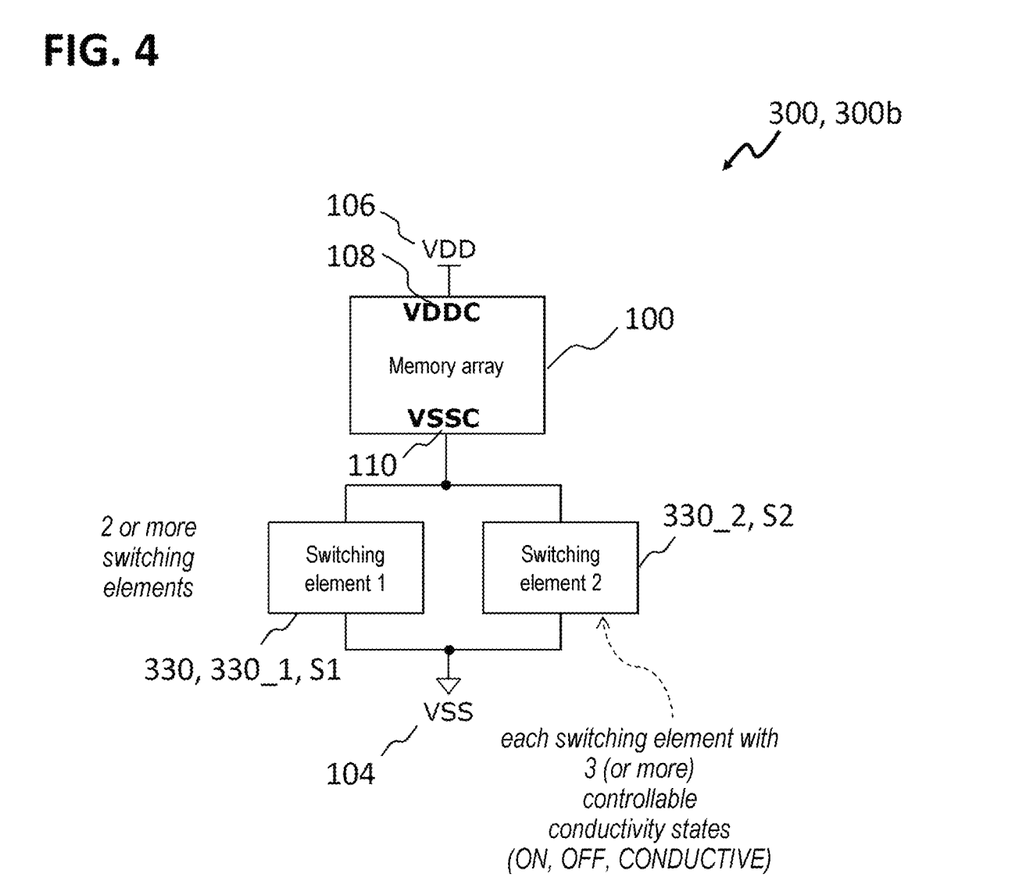
FIG. 4 shows a schematic representation of a memory cell device according to various exemplary embodiments.
Figure 5:
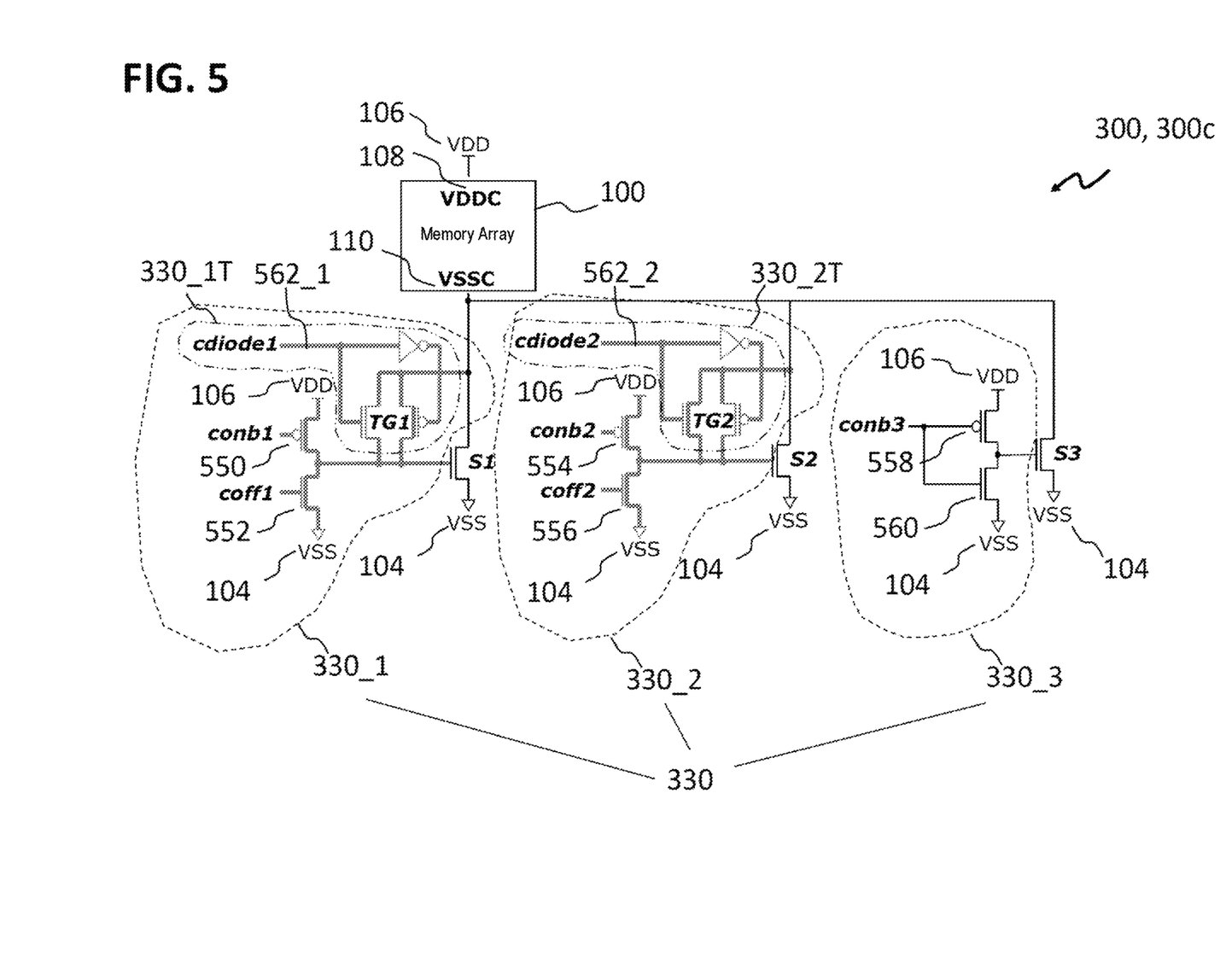
FIG. 5 shows a schematic representation of a memory cell device according to various exemplary embodiments.

FIG. 3 to FIG. 5 respectively shows a schematic representation of a memory cell device 300 according to various exemplary embodiments. The exemplary embodiments of FIG. 3, FIG. 4 and FIG. 5 are respectively distinguished as memory cell device 300a, 300b and 300c. When particular properties of the respective exemplary embodiments are not being referred to, the general reference 300 is used for the memory cell device.

A memory cell device 300 as described herein may, for example, be used in the automobile sector, example using the 28 nm technology.

Figure 1:
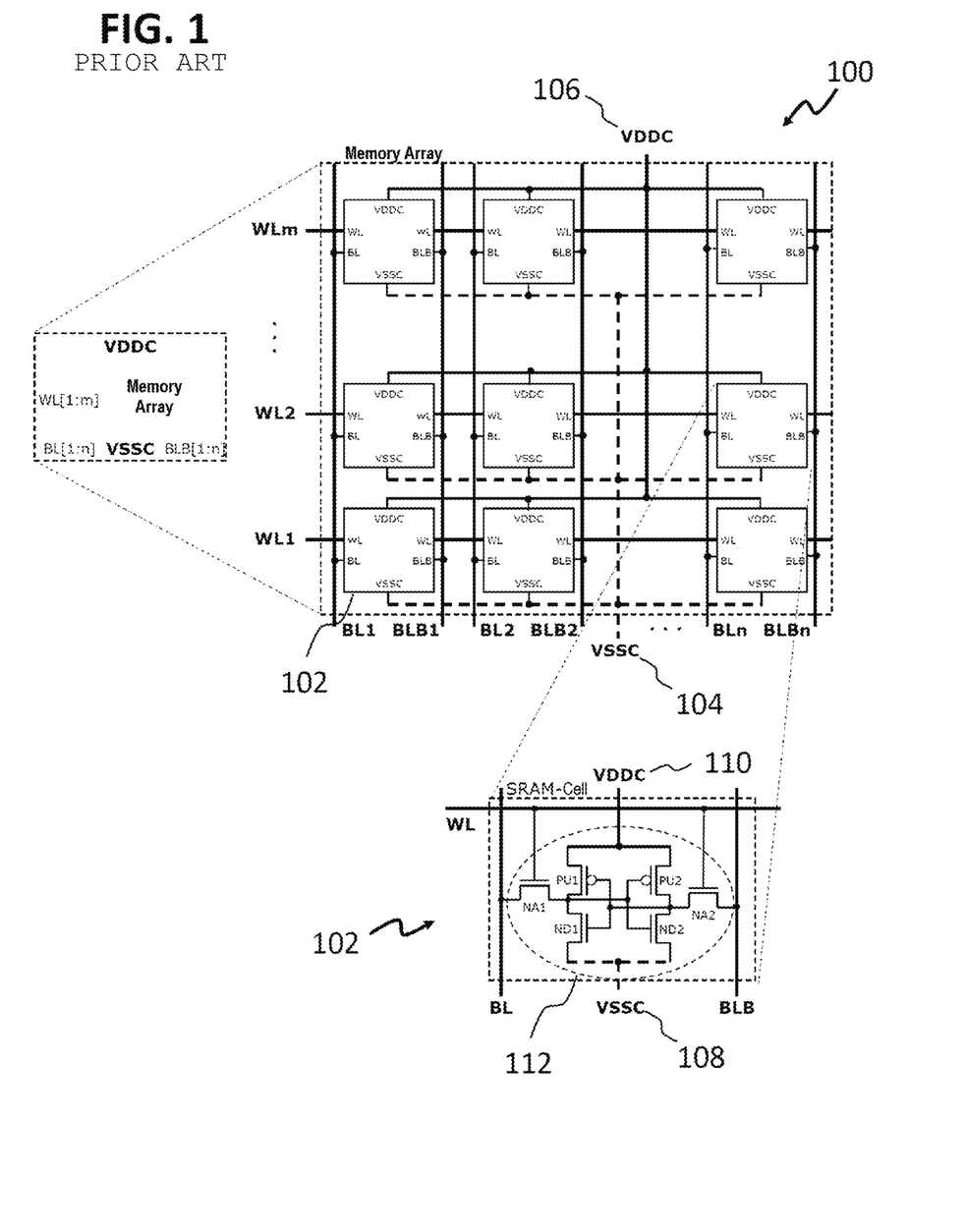
FIG. 1 shows a schematic representation of a memory cell device according to the prior art.

The memory cell device 300 may comprise at least one memory cell 102, for example in the form of a memory cell array 100 (also referred to as a memory array 100). The memory cell 102 may be a conventional memory cell 102, for example an RRAM, MRAM, PC-RAM, ROM or flash memory cell, in particular a conventional volatile memory cell 102, for example a DRAM or SRAM memory cell. The memory cell array 100 may correspondingly be a conventional memory cell array 100, as is represented for example in FIG. 1 and described in connection therewith, for example a memory cell array 100, for example an SRAM, DRAM, RRAM, MRAM, PC-RAM, ROM or flash array.

In order to operate the memory cell array 100, an operating voltage 108, no may be provided at its inputs. This is also denoted in FIG. 3 to FIG. 5 by VDDC for a positive or more positive operating voltage 108 and by VSSC for a negative or more negative operating voltage no, or a ground.

The memory cell device 300 may furthermore provide a positive or more positive reference potential 106 (also denoted by VDD in FIG. 3 to FIG. 5 in analogy with the designation VDD which is conventional for a positive supply voltage) and a negative or more negative or ground reference potential 104 (denoted by VSS in FIG. 3 to FIG. 5 in analogy with the designation VSS which is conventional for a negative supply voltage—often GND).

In a case in which the unchanged reference potential is applied to one of the inputs of the memory cell array 100, the operating voltage 108 or no may be equal to the corresponding reference potential 104 or 106 (in FIG. 3 to FIG. 5 the reference potential 106).

In various exemplary embodiments, the memory cell device 300 may comprise a first switch S1 connected between the at least one memory cell 102 and a reference potential 104 or 106, and a switch driver logic 330. The driver logic may, as represented in FIG. 4 and FIG. 5, be in several parts and, for example, comprise a first part 330_1 for driving the first switch S1, a second part 330_2 for driving a second switch S2, etc. In order to improve clarity, during a description of the functionality of the driver logic 330, sometimes only the reference of the part of the driver logic 330 relevant to the described function is specified. It is to be understood that, by an indication only of this reference, no statement is being made about a functionality (in particular inactivity or the like) of the other parts of the driver logic 330—if present.

The driver logic 330_1 may be adapted to put the first switch S1 selectively into one of at least three operating states by activation or deactivation of a first subcircuit 330_1T (see FIG. 5) of the switch driver logic 330_1. The at least three operating states may comprise an on state, an off state, and a conductive state in which the electrical conductivity is lower than in the on state and higher than in the off state.

In this case, in various exemplary embodiments the switch driver logic 330_1 may be configured in such a way that the first switch S1 is put into the conductive state when the subcircuit 330_1T is activated. For example, the first switch S1 may be a (first) transistor, for example a (first) field-effect transistor, for example a NFET as in FIG. 5 or a PFET (not represented). The switch driver logic 330_1 may be configured in such a way that the subcircuit 330_1T is produced when activating an electrically conductive connection between a controlled output of the first switch S1 and a gate of the first switch S1, so that the first switch S1 (the transistor) is connected as a diode, which is also referred to as diode mode or diode-mode state. In the diode mode, a conductivity of the transistor (and therefore the first switch S1) is lower than in a fully conducting (closed) state of the transistor and higher than in an insulating (opened) state of the transistor.

When the subcircuit 330_1T is deactivated, the first switch S1 may be put into the off state or into the on state. For switching over between the conductive state and the off state of the first switch S1, further switches 550, 552 may be provided in the switch driver logic 330_1, by means of which switches the gate of the first switch S1 may be connected selectively to the positive reference potential 106 or with the negative reference potential 104.

The switch driver logic 330_1 may thus be configured in such a way that, in the on state, the gate is connected to that reference potential 104 or 106 which closes or leaves the first switch S1 closed and therefore connects the at least one memory cell 102 to the reference potential 104 or 106 (in FIGS. 3 to 5: 104), and that, in the off state, the gate is connected to the other reference potential 104 or 104 which closes of leaves the first switch S1 closed, and therefore prevents a connection of the at least one memory cell 102 to the reference potential 104 or 106 (in FIGS. 3 to 5: 104).

For example, in the on state, the gate of the first transistor (i.e., of the first switch S1), also referred to as the first gate, may be connected to a positive voltage supply terminal (the positive reference potential 106), for example VDD. In the off state, the first gate may be connected to a ground terminal 104 (the negative reference potential, for example VSS), and in the conductive state, the first gate may be connected to a virtual voltage supply terminal 110.

In this case, the first field-effect transistor may be an NFET transistor, and the virtual voltage supply terminal 110 may be a ground terminal.

In order to allow switching of the connections of the gate to the positive reference potential 106, the negative reference potential 104 and the virtual voltage supply terminal 110, the switch driver logic 330 may comprise further switches, for example transistors.

For example, the switch driver logic 330 may comprise or consist of a gate control circuit. In the exemplary embodiment of FIG. 5, the gate control circuit for the first switch S1 corresponds to the first part 330_1 of the switch driver logic 330. The gate control circuit may comprise a fourth field-effect transistor 550 between the first gate and the positive voltage supply terminal 106. The gate of the fourth field-effect transistor may be provided with a first switching voltage conb1.

The gate control circuit may furthermore comprise a fifth field-effect transistor 552 between the first gate and the ground terminal 104. The gate of the fifth field-effect transistor 552 may be provided with a second switching voltage coff1.

The gate control circuit may furthermore comprise a sixth field-effect transistor TG1 (or a pair of two field-effect transistors TG1) between the first gate and the virtual voltage supply terminal 110. At the gate of the sixth field-effect transistor TG1 (or at the gate of the pair of two field-effect transistors TG1), a third switching voltage cdiode1 may be provided. The pair of two field-effect transistors may in this case be an NFET transistor and a PFET transistor, in particular a parallel-connected pair of two field-effect transistors.

In various exemplary embodiments, instead of the NFET transistor for the first switch S1, a PFET transistor may for example be used. In this case, the first switch S1 and the switch control logic 330 may be connected between the positive reference potential 106 and the at least one memory cell 102. The negative reference potential 110 (for example the ground terminal VSS) may in this case be provided directly as a supply voltage 104.

The gate control circuit may in this (not represented) case be adapted to connect the first gate to a ground terminal in the on state, to connect the first gate to a positive voltage supply terminal in the off state, and to connect the first gate to a virtual voltage supply terminal in the conductive state. The virtual voltage supply terminal may be a positive voltage supply terminal.

The described configuration makes it possible to provide a memory cell device 300 having a low-energy mode, in which the first switch S1 contributes to the voltage supply of the at least one memory cell 102 in the on and conductive states, and in which components connected in parallel with the switch S1, which are ineffective in one of the switching states, may be obviated. Furthermore, the switch driver logic 330 is of simple design, robust and may have very small dimensions.

In various exemplary embodiments, the memory cell device 300, 300b, 300c may furthermore comprise a second switch S2 connected between the at least one memory cell 102 and the reference potential 104 or 106.

The switch driver logic 330, 330_2 may furthermore be adapted to put the second switch S2 selectively into one of at least three operating states by activation or deactivation of a second subcircuit 330_2T of the switch driver logic 330_2: an on state, an off state, and a conductive state in which the electrical conductivity is lower than in the on state and higher than in the off state.

In other words, the second switch S2 may be provided with a functionality comparable to the first switch S1. A construction of the second switch S2 may be identical or similar to that of the first switch S1. For example, the second switch S2 may be a (second) transistor, for example a (second) field-effect transistor.

The switch driver logic 330 may, in order to drive a gate of the second switch S2, comprise or consist of a second gate control circuit. In the exemplary embodiment of FIG. 5, the gate control circuit for the second switch S2 corresponds to the second part 330_2 of the switch driver logic 330. The gate control circuit may comprise a seventh field-effect transistor 554, an eighth field-effect transistor 556 and a ninth field-effect transistor TG2 (or a pair of two field-effect transistors TG2), which correspond in their function to the field-effect transistors 550, 552 and respectively TG1 of the first gate control circuit. The respective gate of the seventh, eighth and ninth field-effect transistors 554, 556, TG2 may be provided with a fourth, fifth or sixth switching voltage conb2, boff2 or cdiode2. The pair of two field-effect transistors TG2 may in this case be an NFET transistor and a PFET transistor, in particular a parallel-connected pair of two field-effect transistors.

The first switch S1 and the second switch S2 may be connected in parallel with one another, as represented in FIG. 4 and FIG. 5.

The memory cell device 300, 300b, 300c may furthermore comprise further switches (not represented) connected between the at least one memory cell 102 and the reference potential 104 or 106, which have the same functionality as the first switch S1 and the second switch S2, in particular of being capable of being put into one of at least three operating states (an on state, an off state, and a conductive state in which the electrical conductivity is lower than in the on state and higher than in the off state) by means of the switch driver logic 330.

In various exemplary embodiments, both the first switch S1 and the second switch S2 may be adapted to be respectively in one of their three operating states independently of one another. In other words, both switches S1, S2 may be in the on state, both switches S1, S2 may be in the off state, both switches may be in the conductive state, one of the switches may be in the on state and the other switch in the off state, one of the switches may be in the on state and the other switch in the conductive state, or one of the switches may be in the conductive state and the other in the off state.

In the memory cell device 300, in various exemplary embodiments, the switch driver logic 330 may be adapted, by means of putting the first switch S1 and the second switch S2 respectively into one of its three operating states (on state, off state, conductive state), to put the memory cell device 300 selectively into one of at least three power levels: a fully on state, in which the first switch and the second switch are in the on state, a partial power state, in which at least one of the first switch and the second switch is in the conductive state, and a fully off state, in which the first switch and the second switch are in the off state.

The fully on state may be intended for normal operation of the memory cell device 300.

The fully off state may be intended for a full switch-off of the memory cell device 300, i.e. a state in which a loss of the data stored in the at least one memory cell 102 is accepted.

The partial power state may be used for standby operation, i.e., for a state in which no active use of the memory cell device 300 is taking place, i.e., no normal operation in which, for example, writing into the at least one memory cell 102 and/or reading from the at least one memory cell 102 takes place, but in which preservation of the data stored in the at least one memory cell 102, for example the memory cell array 100, is desired.

In various exemplary embodiments, the at least three power levels may furthermore comprise a partially on state, in which the first switch S1 is in the on state and the second switch S2 is in the off state, or vice versa.

The partially on state may be used as an intermediate switching state for a transition from the fully off state or the partial power state to the fully on state, since occurrence of high peak currents can thereby be reduced or avoided. For example, the individual switches may be switched in succession from the off state into the bond state, and the high peak current may thus be avoided.

In various exemplary embodiments, the partially on state and/or the partial power state may be adapted in such a way that a value of a voltage dropped at the at least one memory cell 102 is sufficiently high to ensure continuous data storage.

All the (main) switches S1, S2, . . . , i.e., those switches S1, S2, . . . , which are adapted to switch the supply voltage of the at least one memory cell 102 directly, are adapted, in the normal operating mode (active mode) of the memory cell device 300, in which all the switches S1, S2, . . . are brought into the on state (i.e., in the fully on state), to contribute to the voltage supply of the at least one memory cell 102, for example the memory cell array 100. Series connections of voltage supply switches, which degrade a conductivity, as is represented in the prior art example of FIG. 2B (top), may in this case be obviated. Furthermore, it is possible to save on chip area.

In various exemplary embodiments, the memory cell device 300, 300b, 300c may furthermore comprise a third switch S3 connected between the at least one memory cell 102 and the reference potential 104 or 106. The switch driver logic 330 may be adapted to put the third switch S3 selectively into one of precisely two operating states, namely either into an on state or into an off state.

In other words, the third switch S3 may be provided with a functionality (only on/off) which is reduced compared with the first switch S1 (and, if present, compared with the second switch S2). The third switch may be connected in parallel with the first switch S1 (and optionally with the second switch S2 and optionally further switches), as represented in FIG. 4 and FIG. 5. The third switch S3 may be formed as a transistor (also referred to as the third transistor), for example as a field-effect transistor, for example as an NFET as represented in FIG. 5, or as a PFET (not represented).

A gate of the third switch S3 may be selectively connectable to the positive reference potential 106 or to the negative (ground) reference potential 104. For the selective connection, for example for switching over between the two connections, a tenth transistor 558 may be provided between the gate and the positive reference potential 106, and an eleventh transistor 560 may be provided between the gate and the negative (ground) reference potential 104. A common seventh switching voltage conb3 may be provided at the gates of the tenth and eleventh transistors 558, 560.

The third switch S3 may be considered as the main energy supply switch. Since in the normal operating mode, besides the main energy supply switch S3, the first switch S1 and optionally the second switch S2 and optionally further switches also make a contribution to the energy supply of the at least one memory cell, the third switch S3 may have smaller dimensions.

In a similar way to the above-described memory cell device 300, 300b having the first switch S1 and the second switch S2, the switch driver logic 330 of the memory cell device 300c may be adapted, by means of putting the first switch S1 and the second switch S2 respectively into one of its three operating states and the third switch S3 into one of its two operating states, to put the memory cell device 300c selectively into one of at least three power levels: a fully on state, in which the first switch, the second switch and the third switch are in the on state, a partial power state, in which at least one of the first switch and the second switch is in the conductive state, and a fully off state, in which the first switch, the second switch and the third switch are in the off state.

In the exemplary embodiment of FIG. 5, the off state may, for example, be achieved by connecting the respective gate of the first or second or third switch S1, S2 or S3, which are respectively formed as NFET transistors, to the negative reference potential 104, for example VSS. This may, for example, be achieved as described below.

In various exemplary embodiments, the at least three power levels may furthermore comprise a partially on state, in which at least one of the first switch S1, the switch second S2 and the third switch S3 is in the on state and at least one of the other two switches is in the off state.

A use of the power levels may correspond analogously to that which is described above for the memory cell device 300b having the two switches S1, S2.

The fully off state may, in various exemplary embodiments (as for example represented in FIG. 5; there, for the fully off state, the three switches S1, S2 and S3 are to be brought into the off state), be achieved by providing a negative (or ground) reference potential as the virtual reference potential, i.e., as cdiode1 or cdiode2, respectively providing a positive reference potential (conb1, conb2 or conb3 are, for example, VDD) at the gate of the fourth transistor 550, of the seventh transistor 554 and of the tenth transistor 558, and respectively likewise providing a positive reference potential (coff1, coff2 are, for example, VDD) at the gate of the fifth transistor 552 and of the eighth transistor 556.

In various exemplary embodiments, the first switch S1 may have a higher electrical conductivity than the second switch S2 in the conductive state. As a simple form of technical embodiment, this may for example be achieved by the first switch S1 being a first field-effect transistor and the second switch S2 being a second field-effect transistor, the first field-effect transistor having a greater transistor width than the second field-effect transistor.

In various exemplary embodiments, as a further simple technical embodiment of different conductivities, as an alternative or in addition the first field-effect transistor (i.e., the first switch S1) may have a lower threshold voltage than the second field-effect transistor (i.e., the second switch S2).

More different configurations/settings are therefore made possible for a low-energy mode (for example the partial power mode; optionally, the partially on mode could also be regarded as a low-energy mode).

Figure 6:
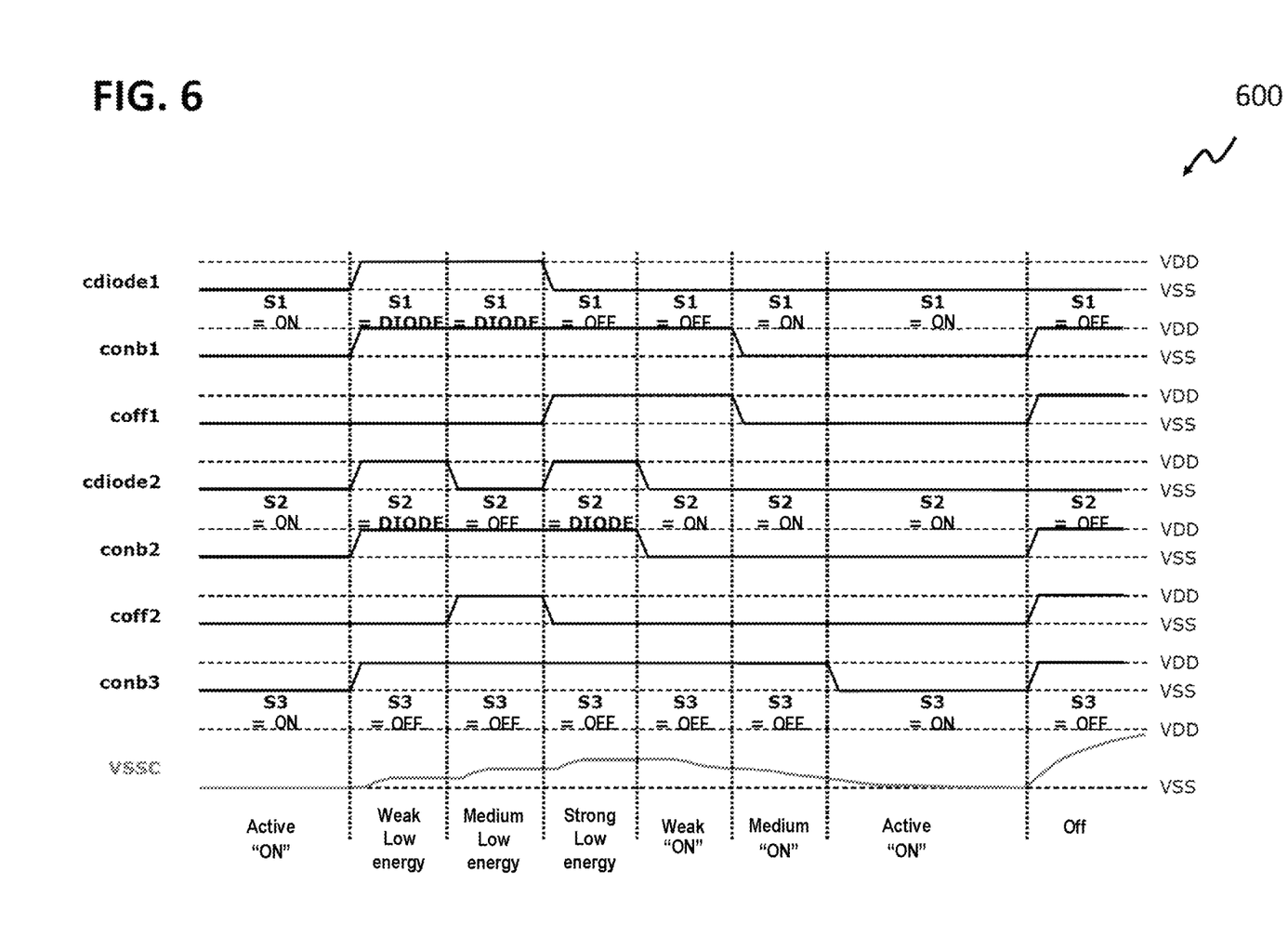
FIG. 6 shows a schematic representation of switching states in a memory cell device according to various exemplary embodiments.

For illustration, FIG. 6 represents different combinations of operating states for the three switches S1, S2 and S3 of the exemplary embodiment of FIG. 5, which lead to the power levels referred to at the lower edge, which range from Active "ON" to "Off" and comprise as intermediate levels three power levels denoted as "Low Energy" (Weak/Medium/Strong) a "Weak ON" and a "Medium ON" (these would correspond to the partially on modes described above).

As is illustrated by way of example with the aid of FIG. 6, for example the power level "Medium Low Energy" differs from the power level "Strong Low Energy", even though in both power levels one of the switches S1, S2 is respectively in diode mode and the other is off. Such differentiation is made possible precisely by the above-described different configuration of the switches, for example in respect of their electrical conductivity. In the present case, the first switch S1 is a higher conductivity than the second switch S2.

An operating voltage 110 or 108, with which the at least one memory cell 102 is provided in the low-energy mode, may accordingly, by using a plurality of optionally differently configured switches S1, S2, . . . , be finely adjusted and tuned to a requirement of the at least one memory cell 102, for example of the memory array 100.

In various exemplary embodiments, the requirements of the at least one memory cell 102 may be determined during a test phase, i.e. it is possible to determine which operating voltage is necessary for data preservation, and the conductive state of the first and/or the second switch S1, S2, and/or a combination of the power levels to be implemented, may be set up in such a way that the ascertained operating voltage is ensured even in the low-energy mode.

Such flexibility may be advantageous because variations during production of the semiconductor apparatus may lead to memory cells 102, or memory arrays 100, having different properties. In particular, some memory arrays 100 may have a need for a higher maintenance voltage (VDDC-VSSC) (which is provided in the low-energy mode) than others. For example, one memory array 100 may require 0.6 V in order to ensure preservation of the data stored in it, while another memory array 100 possibly requires only 0.5 V.

Adjusting the maintenance voltage for all the memory arrays 100 according to the memory array 100 which requires the highest voltage would unnecessarily increase the energy consumption for some of the memory arrays 100, because the memory array 100 which actually requires a lower voltage is operated with an unnecessarily high voltage during the low-energy mode (for example, it could in fact be operated with 0.5 V but 0.6 V is used).

In various exemplary embodiments, a configurable voltage supply (i.e., of VDDC, VSSC or both) is provided. In this case, the configuration, i.e. adaptation of the maintenance voltage to the variations in the production process, may for example be carried out during production tests.

The adaptations or tuning may, in various exemplary embodiments, be carried out at the wafer level, i.e., in such a way that all the chips on a wafer are provided with the same adjustment, but each wafer receives its own adjustment.

In various exemplary embodiments, the adaptation or tuning may be carried out at the chip level, i.e., in such a way that all the memory arrays 100 of a chip are provided with the same adjustment, but each chip receives its own adjustment.

In various exemplary embodiments, the adaptation or tuning may be carried out at the memory level, i.e., in such a way that each memory array 100 of a chip is provided with its own adjustment.

In various exemplary embodiments, an energy consumption of the memory cell device 300 is reduced.

The reduction of the required chip area and the reduced energy consumption lead directly or indirectly to a cost reduction (for example in that a reduced energy consumption may lead to cost savings for chip packages, voltage supply apparatuses and/or cooling apparatuses).

Furthermore, the possibility of adjusting the maintenance voltage in a relatively finely tuned way after a test may increase the yield during production.

Figure 7:
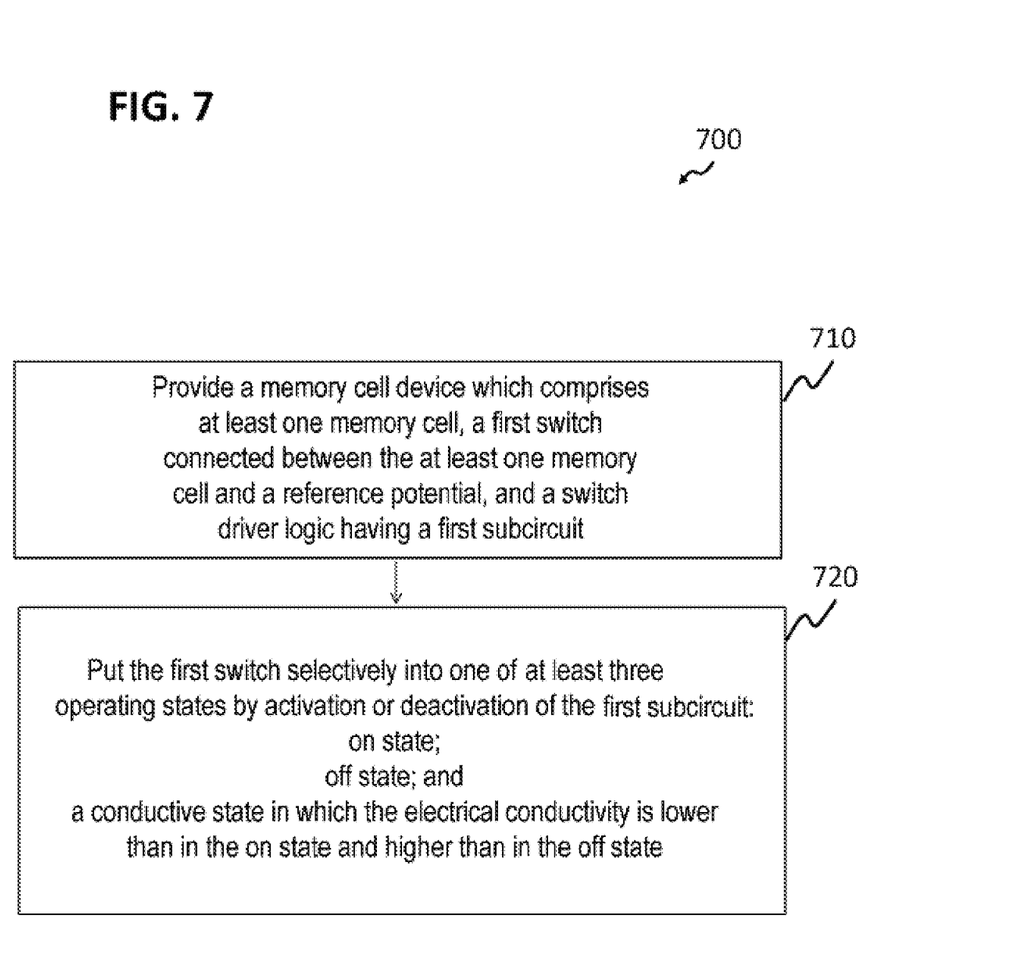
FIG. 7 shows a flowchart of a method for operating a memory cell device according to various exemplary embodiments.

FIG. 7 shows a flowchart of a method 700 for operating a memory cell device according to various exemplary embodiments.

The method 700 may comprise providing the memory cell device which comprises at least one memory cell, a first switch connected between the at least one memory cell and a reference potential, and a switch driver logic having a first subcircuit (at 710).

The method may furthermore comprise putting the first switch selectively into one of at least three operating states by activation or deactivation of the first subcircuit: an on state, an off state, and a conductive state in which the electrical conductivity is lower than in the on state and higher than in the off state (in 720).

Some exemplary embodiments will be specified in brief below.

Exemplary embodiment 1 is a memory cell device. The memory cell device may comprise at least one memory cell, a first switch connected between the at least one memory cell and a reference potential, and a switch driver logic, which is adapted to put the first switch selectively into one of at least three operating states by activation or deactivation of a first subcircuit of the switch driver circuit: on state, off state, and a conductive state in which the electrical conductivity is lower than in the on state and higher than in the off state.

Exemplary embodiment 2 is a memory cell device according to exemplary embodiment 1, which furthermore comprises a second switch connected between the at least one memory cell and the reference potential, the switch driver logic furthermore being adapted to put the second switch selectively into one of at least three operating states by activation or deactivation of a second subcircuit of the switch driver logic: on state, off state, and a conductive state in which the electrical conductivity is lower than in the on state and higher than in the off state.

Exemplary embodiment 3 is a memory cell device according to exemplary embodiment 1 or 2, which furthermore comprises a third switch connected between the at least one memory cell and the reference potential, the switch driver logic furthermore being adapted to put the third switch selectively into one of precisely two operating states: on state and off state.

Exemplary embodiment 4 is a memory cell device according to exemplary embodiment 2 or 3, wherein the first switch in the conductive state has a higher electrical conductivity than the second switch in the conductive state.

Exemplary embodiment 5 is a memory cell device according to one of exemplary embodiments 1 to 4, wherein the first switch comprises a field-effect transistor.

Exemplary embodiment 6 is a memory cell device according to exemplary embodiment 5, wherein the conductive state of the first field-effect transistor is a diode-mode state of the first field-effect transistor.

Exemplary embodiment 7 is a memory cell device according to one of exemplary embodiments 2 to 6, wherein the second switch comprises a second field-effect transistor.

Exemplary embodiment 8 is a memory cell device according to exemplary embodiment 7, wherein the conductive state of the second field-effect transistor is a diode-mode state of the second field-effect transistor.

Exemplary embodiment 9 is a memory cell device according to exemplary embodiment 7 or 8, wherein the first field-effect transistor comprises a greater transistor width than the second field-effect transistor.

Exemplary embodiment 10 is a memory cell device according to one of exemplary embodiments 7 to 9, wherein the first field-effect transistor has a lower threshold voltage than the second field-effect transistor.

Exemplary embodiment 11 is a memory cell device according to one of exemplary embodiments 5 to 10, wherein the first field-effect transistor comprises a first gate, wherein the switch driver logic comprises a first gate control circuit, which is adapted to connect the first gate to a positive voltage supply terminal in the on state, to connect the first gate to a ground terminal in the off state, and to connect the first gate to a virtual voltage supply terminal in the conductive state.

Exemplary embodiment 12 is a memory cell device according to exemplary embodiment 11, wherein the first field-effect transistor is an NFET transistor, and wherein the virtual voltage supply terminal is a ground terminal.

Exemplary embodiment 13 is a memory cell device according to one of exemplary embodiments 5 to 10, wherein the first field-effect transistor comprises a first gate, wherein the switch driver logic comprises a first gate control circuit, which is adapted to connect the first gate to a ground terminal in the on state, to connect the first gate to a positive voltage supply terminal in the off state, and to connect the first gate to a virtual voltage supply terminal in the conductive state.

Exemplary embodiment 14 is a memory cell device according to exemplary embodiment 13, wherein the first field-effect transistor is a PFET transistor, and wherein the virtual voltage supply terminal is a positive voltage supply terminal.

Exemplary embodiment 15 is a memory cell device according to one of exemplary embodiments 11 to 14, wherein the gate control circuit comprises a third field-effect transistor between the first gate and the positive voltage supply terminal.

Exemplary embodiment 16 is a memory cell device according to one of exemplary embodiments 11 to 15, wherein the gate control circuit comprises a fourth field-effect transistor between the first gate and the ground terminal.

Exemplary embodiment 17 is a memory cell device according to one of exemplary embodiments 11 to 16, wherein the gate control circuit comprises a fifth field-effect transistor between the first gate and the virtual voltage supply terminal.

Exemplary embodiment 18 is a memory cell device according to exemplary embodiment 2, wherein the switch driver logic is adapted, by means of putting the first switch and the second switch respectively into one of its three operating states, to put the memory cell device selectively into one of at least three power levels: a fully on state, in which the first switch and the second switch are in the on state, a partial power state, in which at least one of the first switch and the second switch is in the conductive state, and a fully off state, in which the first switch and the second switch are in the off state.

Exemplary embodiment 19 is a memory cell device according to exemplary embodiment 18, wherein the at least three power levels furthermore comprise a partially on state, in which the first switch is in the on state and the second switch is in the off state, or vice versa.

Exemplary embodiment 20 is a memory cell device according to exemplary embodiment 3, wherein the switch driver logic is adapted, by means of putting the first switch and the second switch respectively into one of its three operating states and the third switch into one of its two operating states, to put the memory cell device selectively into one of at least three power levels: a fully on state, in which the first switch, the second switch and the third switch are in the on state, a partial power state, in which at least one of the first switch and the second switch is in the conductive state, and a fully off state, in which the first switch, the second switch and the third switch are in the off state.

Exemplary embodiment 21 is a memory cell device according to exemplary embodiment 20, wherein the at least three power levels furthermore comprise a partially on state, in which at least one of the first, the second and the third switch is in the on state and at least one of the other two switches is in the off state.

Exemplary embodiment 22 is a memory cell device according to one of exemplary embodiments 18 to 21, wherein the partial power state and/or the partially on state are configured in such a way that a value of a voltage dropped at the at least one memory cell is sufficiently high to ensure continuous data storage.

Exemplary embodiment 23 is a memory cell device according to one of exemplary embodiments 1 to 22, wherein the memory cell device forms a volatile data memory.

Exemplary embodiment 24 is a memory cell device according to one of exemplary embodiments 1 to 23, wherein the memory cell device forms an SRAM, DRAM, RRAM, MRAM, PC-RAM, ROM or flash data memory.

Exemplary embodiment 25 is a method for operating a memory cell device, which comprises at least one memory cell, a first switch connected between the at least one memory cell and a reference potential, and a switch driver logic having a first subcircuit, the method comprising putting the first switch selectively into one of at least three operating states by activation or deactivation of the first subcircuit: an on state, an off state, and a conductive state in which the electrical conductivity is lower than in the on state and higher than in the off state.

Exemplary embodiment 26 is a method according to exemplary embodiment 25, wherein the memory cell device furthermore comprises a second switch connected between the at least one memory cell and the reference potential and a second subcircuit in the switch driver logic, the method furthermore comprising putting the second switch selectively into one of at least three operating states by activation or deactivation of the second subcircuit: on state, off state, and a conductive state in which the electrical conductivity is lower than in the on state and higher than in the off state.

Exemplary embodiment 27 is a method according to exemplary embodiment 25 or 26, wherein the memory cell device furthermore comprises a third switch connected between the at least one memory cell and the reference potential, the method furthermore comprising: putting the third switch selectively into one of precisely two operating states: an on state and an off state.

Exemplary embodiment 28 is a method according to exemplary embodiment 26, furthermore comprising putting the first switch and the second switch respectively into one of its three operating states in order to put the memory cell device selectively into one of at least three power levels: a fully on state, in which the first switch and the second switch are in the on state, a partial power state, in which at least one of the first switch and the second switch is in the conductive state, and a fully off state, in which the first switch and the second switch are in the off state.

Exemplary embodiment 29 is a method according to exemplary embodiment 28, wherein the at least three power levels furthermore comprise a partially on state, in which the first switch is in the on state and the second switch is in the off state, or vice versa.

Exemplary embodiment 30 is a method according to exemplary embodiment 27, furthermore comprising putting the first switch and the second switch respectively into one of its three operating states and the third switch into one of its two operating states in order to put the memory cell device selectively into one of at least three power levels: a fully on state, in which the first switch, the second switch and the third switch are in the on state, a partial power state, in which at least one of the first switch and the second switch is in the conductive state, and a fully off state, in which the first switch, the second switch and the third switch are in the off state.

Exemplary embodiment 31 is a method according to exemplary embodiment 30, wherein the at least three power levels furthermore comprise a partially on state, in which at least one of the first, the second and the third switch is in the on state and at least one of the other two switches is in the off state.

Exemplary embodiment 32 is a method according to one of exemplary embodiments 28 to 31, furthermore comprising putting the memory cell device into the fully on state for active operation.

Exemplary embodiment 33 is a method according to one of exemplary embodiments 28 to 32, furthermore comprising putting the memory cell device into the partial power state for standby operation.

Exemplary embodiment 34 is a method according to one of exemplary embodiments 29 and 31, furthermore comprising:

when putting the memory cell device from the fully off state into the fully on state, initially putting the memory cell device from the fully off state into the partially on state, and subsequently putting the memory cell device from the partially on state into the fully on state.

What is claimed is:

1. A memory cell device, comprising:
   at least one memory cell;
   a first switch connected between the at least one memory cell and a reference potential node, the first switch configured to be selectively put into each one of at least three operating states comprising an on state, an off state and a static conductive state, wherein an electrical conductivity of the first switch in the static conductive state is lower than in the on state and higher than in the off state; and
   a second switch connected between the at least one memory cell and the reference potential node, the second switch configured to be selectively put into each one of the at least three operating states independent from the first switch, wherein an electrical conductivity of the second switch in the static conductive state is lower than in the on state and higher than in the off state, and wherein the first switch and the second switch are coupled in parallel.

2. The memory cell device of claim 1, further wherein the memory cell device comprises a controller adapted to
   put the first switch selectively into one of the at least three operating states by activating or deactivating a first subcircuit of the controller, and
   put the second switch selectively into one of the at least three operating states by activating or deactivating a second subcircuit of the controller.

3. The memory cell device of claim 2, wherein the controller comprises a logic circuit.

4. The memory cell device as claimed in claim 2, further comprising:
   a third switch connected between the at least one memory cell and the reference potential node, wherein the controller is further being adapted to put the third switch selectively into one of precisely two operating states, wherein the two operating states comprise the on state and the off state.

5. The memory cell device as claimed in claim 4, wherein the controller is adapted to put the memory cell device selectively into one of at least three power levels by putting the first switch and the second switch respectively into one of its three operating states and the third switch into one of the two operating states, wherein the at least three power levels comprise:
   a fully on state, in which the first switch, the second switch and the third switch are in the on state;
   a partial power state, in which at least one of the first switch and the second switch is in the static conductive state; and
   a fully off state, in which the first switch, the second switch and the third switch are in the off state.

6. The memory cell device as claimed in claim 5, wherein, in the partial power state, at least one of the first, the second and the third switch is in the on state and at least one of the other two switches is in the off state.

7. The memory cell device as claimed in claim 2, wherein the controller is adapted to put the memory cell device selectively into one of at least three power levels by putting the first switch and the second switch respectively into one of its three operating states, wherein the at least three power levels comprise:
   a fully on state, in which the first switch and the second switch are in the on state;
   a partial power state, in which at least one of the first switch and the second switch is in the static conductive state; and
   a fully off state, in which the first switch and the second switch are in the off state.

8. The memory cell device as claimed in claim 7, wherein that at least three power levels comprise a partially on state in which:
   the first switch is in the on state and the second switch is in the off state; or
   the first switch is in the off state and the second switch is in the on state.

9. The memory cell device as claimed in claim 8, wherein, in the partial power state or in the partially on state, a value of a voltage dropped at the at least one memory cell is sufficiently high to ensure continuous data storage.

10. The memory cell device as claimed in claim 1, wherein the first switch in the static conductive state has a higher electrical conductivity than the second switch in the static conductive state.

11. The memory cell device as claimed in claim 1, wherein:
    the first switch comprises a first field-effect transistor; and
    the second switch comprises a second field-effect transistor.

12. The memory cell device as claimed in claim 11, wherein:
    the static conductive state of the first field-effect transistor is a diode-mode state of the first field-effect transistor; and
    the static conductive state of the second field-effect transistor is a diode-mode state of the second field-effect transistor.

13. The memory cell device as claimed in claim 11, wherein:
    the first field-effect transistor comprises a greater transistor width than the second field-effect transistor; or
    the first field-effect transistor has a lower threshold voltage than the second field-effect transistor.

14. The memory cell device as claimed in claim 11, wherein the first field-effect transistor comprises a first gate.

15. The memory cell device as claimed in claim 14, further comprising a controller adapted to:
    put the first switch selectively into one of the at least three operating states by activating or deactivating a first subcircuit of controller, and
    put the second switch selectively into one of the at least three operating states by activating or deactivating a second subcircuit of the controller, wherein the controller comprises a first gate control circuit adapted to connect the first gate to a positive voltage supply terminal in the on state, to connect the first gate to a ground terminal in the off state, and to connect the first gate to a virtual voltage supply terminal in the static conductive state.

16. The memory cell device as claimed in claim 14, further comprising: a controller adapted to:

put the first switch selectively into one of the at least three operating states by activating or deactivating a first subcircuit of the controller, and put the second switch selectively into one of the at least three operating states by activating or deactivating a second subcircuit of the controller, wherein the controller comprises a gate control circuit adapted to connect the first gate to a ground terminal in the on state, to connect the first gate to a positive voltage supply terminal in the off state, and to connect the first gate to a virtual voltage supply terminal in the static conductive state.

17. The memory cell device as claimed in claim 16, wherein the gate control circuit comprises:
a third field-effect transistor coupled between the first gate and the positive voltage supply terminal;
a fourth field-effect transistor coupled between the first gate and the ground terminal; and
a fifth field-effect transistor between the first gate and the virtual voltage supply terminal.

18. The memory cell device as claimed in claim 16,
wherein the first field-effect transistor is an NFET transistor; and
wherein the virtual voltage supply terminal is a ground terminal.

19. The memory cell device as claimed in claim 16,
wherein the first field-effect transistor is a PFET transistor; and
wherein the virtual voltage supply terminal is the positive voltage supply terminal.

20. The memory cell device as claimed in claim 14, wherein the memory cell device forms a volatile data memory.

21. The memory cell device as claimed in claim 1, wherein the memory cell device forms an SRAM, DRAM, RRAM, MRAM, PC-RAM, ROM or flash data memory.

22. The memory cell device as claimed in claim 1, wherein the first switch and the second switch are configured to be simultaneously placed in the static conductive state.

23. The memory cell device as claimed in claim 1, wherein:
the first switch is configured as a first diode-connected transistor in the static conductive state; and
the second switch is configured as a second diode-connected transistor in the static conductive state.

24. A method for operating a memory cell device comprising at least one memory cell; a first switch connected between the at least one memory cell and a reference potential node; a second switch connected between the at least one memory cell and the reference potential node; and switch driver logic having a first subcircuit and a second subcircuit, wherein the first switch and the second switch are each configured to be selectively and independently put into each one of at least three operating states comprising an on state, an off state and a static conductive state, wherein an electrical conductivity of the first switch and the second switch in the static conductive state is lower than in the on state and higher than in the off state, and wherein the first switch and the second switch are coupled in parallel, the method comprising:
putting the first switch selectively into one of the at least three operating states.

25. The method of claim 24, further comprising putting the second switch selectively into one of the at least three operating states.

26. The method of claim 24, wherein the first switch is selectively put into one of the at least three operating states by activating or deactivating the first subcircuit.

27. The method for operating the memory cell device as claimed in claim 24, wherein the memory cell device furthermore comprises a third switch connected between the at least one memory cell and the reference potential node, the method further comprises:
putting the third switch selectively into one of precisely two operating states comprising the on state and the off state.

28. The method for operating the memory cell device as claimed in claim 27, further comprising:
putting the first switch and the second switch respectively into one of its three operating states and the third switch into one of its two operating states in order to put the memory cell device selectively into one of at least three power levels:
a fully on state, in which the first switch, the second switch and the third switch are in the on state;
a partial power state, in which at least one of the first switch and the second switch is in the static conductive state; and
a fully off state, in which the first switch, the second switch and the third switch are in the off state.

29. The method for operating the memory cell device as claimed in claim 28, the at least three power levels further comprises a partially on state in which one of the first switch, the second switch and the third switch is in the on state and at least one of the other two switches is in the off state.

30. The method for operating the memory cell device as claimed in claim 24, further comprising:
putting the first switch and the second switch respectively into one of its three operating states in order to put the memory cell device selectively into one of at least three power levels:
a fully on state, in which the first switch and the second switch are in the on state;
a partial power state, in which at least one of the first switch and the second switch is in the static conductive state; and
a fully off state, in which the first switch and the second switch are in the off state.

31. The method for operating the memory cell device as claimed in claim 30,
wherein that at least three power levels further comprises a partially on state in which the first switch is in the on state and the second switch is in the off state, or the first switch is in the off state and the second switch is in the on state.

32. The method for operating the memory cell device as claimed in claim 31, further comprising:
when putting the memory cell device from the fully off state into the fully on state, initially putting the memory cell device from the fully off state into the partially on state, and subsequently putting the memory cell device from the partially on state into the fully on state.

33. The method for operating the memory cell device as claimed in claim 30, further comprising:
putting the memory cell device into the fully on state for active operation; and
putting the memory cell device into the partial power state for standby operation.

34. A memory cell device comprising:
a means for storing data;
a first means for switching coupled between the means for storing data and a means for providing a reference potential, the first means for switching configured to be selectively put into each one of at least three operating states comprising an on state, an off state and a static conductive state, wherein an electrical conductivity of the first means for switching in the static conductive state is lower than in the on state and higher than in the off state; and a second means for switching coupled between the means for storing data and the means for providing the reference potential, the second means for switching configured to be selectively put into each one of the at least three operating states independent from the first switch, wherein an electrical conductivity of the second means for switching in the static conductive state is lower than in the on state and higher than in the off state, wherein the first means for switching and the second means for switching is coupled in parallel.

35. The memory cell device of claim 34, further comprising means for controlling adapted to put the first means for switching and the second means for switching selectively into one of the at least three operating states.

\* \* \* \* \*